(12) United States Patent
Ward

(10) Patent No.: US 10,714,338 B2
(45) Date of Patent: Jul. 14, 2020

(54) WAFER BOW REDUCTION

(71) Applicant: Anvil Semiconductors Limited, Warwickshire (GB)

(72) Inventor: Peter Ward, Cambridgeshire (GB)

(73) Assignee: ANVIL SEMICONDUCTORS LIMITED, Warwickshire (GB)

( * ) Notice: Subject to any disclaimer, the term of this patent is extended or adjusted under 35 U.S.C. 154(b) by 0 days.

(21) Appl. No.: 15/649,733

(22) Filed: Jul. 14, 2017

(65) Prior Publication Data
US 2017/0323790 A1 Nov. 9, 2017

Related U.S. Application Data

(63) Continuation-in-part of application No. PCT/GB2015/054159, filed on Dec. 23, 2015.

(30) Foreign Application Priority Data

Jan. 14, 2015 (GB) .................................. 1500558.0

(51) Int. Cl.
*C30B 25/18* (2006.01)
*H01L 21/02* (2006.01)
(Continued)

(52) U.S. Cl.
CPC ........ *H01L 21/02694* (2013.01); *C30B 25/02* (2013.01); *C30B 25/18* (2013.01); *C30B 29/06* (2013.01); *C30B 29/36* (2013.01); *H01L 21/0262* (2013.01); *H01L 21/02378* (2013.01); *H01L 21/02381* (2013.01); *H01L 21/02529* (2013.01); *H01L 21/02576* (2013.01); *H01L 29/0834* (2013.01); *H01L 29/1608* (2013.01); *H01L 29/34* (2013.01);
(Continued)

(58) Field of Classification Search
CPC ..... C30B 29/36; C30B 25/02; H01L 29/1608; H01L 21/02529; H01L 21/02378
See application file for complete search history.

(56) References Cited

U.S. PATENT DOCUMENTS

2002/0119250 A1 8/2002 Campana
2004/0259379 A1 12/2004 Ono
(Continued)

FOREIGN PATENT DOCUMENTS

CN 102931072 A 2/2013
GB 2495949 A * 5/2013 ....... H01L 21/02381
(Continued)

OTHER PUBLICATIONS

International Search Report and Written Opinion dated Mar. 2, 2016 for corresponding International Application No. PCT/GB2015/054159 filed Dec. 23, 2015.
(Continued)

*Primary Examiner* — Matthew J Song
(74) *Attorney, Agent, or Firm* — Tarolli, Sundheim, Covell & Tummino LLP

(57) ABSTRACT

We describe a method for reducing bow in a composite wafer comprising a silicon wafer and a silicon carbide layer grown on the silicon wafer. The method includes applying nitrogen atoms during the growth process of the silicon carbide layer on the silicon wafer so as to generate a compressive stress within the composite wafer.

21 Claims, 4 Drawing Sheets

(51) Int. Cl.

| | | |
|---|---|---|
| *H01L 29/739* | (2006.01) | |
| *H01L 29/16* | (2006.01) | |
| *H01L 29/66* | (2006.01) | |
| *H01L 29/08* | (2006.01) | |
| *C30B 25/02* | (2006.01) | |
| *C30B 29/06* | (2006.01) | |
| *C30B 29/36* | (2006.01) | |
| *H01L 29/34* | (2006.01) | |
| H01L 29/78 | (2006.01) | |
| H01L 29/861 | (2006.01) | |

(52) U.S. Cl.
CPC .... *H01L 29/66068* (2013.01); *H01L 29/7395* (2013.01); *H01L 29/7802* (2013.01); *H01L 29/861* (2013.01)

(56) References Cited

U.S. PATENT DOCUMENTS

| | | | | |
|---|---|---|---|---|
| 2006/0008661 A1* | 1/2006 | Wijesundara | ......... | C23C 16/325 428/446 |
| 2011/0006309 A1* | 1/2011 | Momose | ............... | C23C 16/325 257/77 |
| 2013/0221377 A1* | 8/2013 | Ward | .................... | C30B 25/183 257/77 |
| 2014/0014973 A1* | 1/2014 | Ward | ................ | H01L 21/02381 257/77 |
| 2015/0108504 A1* | 4/2015 | Watanabe | ......... | H01L 21/02447 257/77 |

FOREIGN PATENT DOCUMENTS

| | | |
|---|---|---|
| WO | 2005057630 A2 | 6/2005 |
| WO | 2009143618 A1 | 12/2009 |

OTHER PUBLICATIONS

Zorman et al., "Epitaxial Growth of 3C-Sic Films on 4 In. Diam (100) Silicon Wafersby Atmosphere Pressure Chemical Vapor Deposition", Journal of Applied Physics, vol. 78, No. 8, USA, Oct. 15, 1995.

Shi-Yang et al., "Experiment on Alleviating the Bending of CVD-grown Heavily Al-doped 4H—SiC epiwafer by aodoping of N", Japanese Journal of Applied Physics, vol. 54, No. 4S, JP, Sep. 8, 2014.

Nikitina et al., "Deformation of Nitrogen Doped Cubic Polytype SiC", Diamond and Related Materials, Elsevier Science Publishers, vol. 4, No. 5-6, NL, May 1, 1995.

United Kingdom Search Report dated Sep. 4, 2015 for corresponding GB Application No. 1500558.0.

Tokuhito Sasaki et al, "Temperature Dependence of Electrical Properties of Nitrogen-Doped 3C—SiC", Japanese Journal of Applied Physics, Jan. 1, 1987, p. 533.

Summons to attend oral proceedings dated May 22, 2019 for corresponding EP application No. 15817533.1.

Mitsugu Yamanaka et al, "Temperature Dependence of Electrical Properties of Nitrogen-Doped 3C-SiC" Japanese Journal of Applied Physicals, vol. 26.

Chinese Office Action dated Mar. 18, 2020 for corresponding Chinese Application No. 20150073382.3.

\* cited by examiner

WAFER BOW REDUCTION

RELATED APPLICATIONS

This application is a Continuation-in-Part of International Patent Application No. PCT/GB2015/054159, filed on 23 Dec. 2016; which claims priority from 1500558.0, filed 14 Jan. 2015, the entirety of both of which are incorporated herein by reference.

FIELD OF THE INVENTION

This invention relates to bow reduction in a composite wafer, particularly but not exclusively, in a silicon carbide (SiC) based composite wafer.

BACKGROUND TO THE INVENTION

The challenge in producing silicon carbide/silicon, particularly 3-step cubic silicon carbide (3C—SiC) and Si heteroepitaxy, is the tensile stress introduced at the Si/SiC interface due to the lattice miss-match between the two materials and the faster thermal contraction of SiC while cooling down from the typical growth temperature of 1370° C.

It has already been demonstrated that dividing the surface of the wafer into sub-die of the order of 2.5 mm per side with thin lines of polycrystalline SiC is beneficial in terms of reducing the wafer bow induced by these tensile stresses.

It is an aim of the present invention to reduce the wafer bow using an efficient technique.

SUMMARY

The present invention reduces wafer bow by introducing a countermanding compressive stress at the critical place in the composite wafer, i.e. at the Si/SiC interface. There are two motivations for wishing to reduce stress and bow. The first is to improve the robustness of the wafer, because highly stressed wafers break easily. The second is to produce as flat a wafer as possible to facilitate its processing through the various equipment used to realise microelectronic components.

According to one aspect of the present invention, there is provided a method for reducing bow in a composite wafer comprising a silicon wafer and a silicon carbide layer grown on the silicon wafer. The method comprises applying nitrogen atoms during the epitaxial growth of the silicon carbide epitaxial layer on the silicon wafer so as to generate a compressive stress within the composite wafer. The technique allows the nitrogen atoms to be incorporated into the wafer during the initial epitaxial growth process of the epitaxial layer. This technique generates a compressive stress within the wafer which countermands the bow causing tensile stress within the wafer.

According to a further aspect of the present invention, there is provided a method of manufacturing a composite wafer, the method comprising: forming a silicon wafer; thermally growing a silicon carbide epitaxial layer on the silicon wafer to form the composite wafer; and applying nitrogen atoms during the thermal growth of the silicon carbide layer so as to generate a compressive stress within the composite wafer.

The nitrogen atoms may be applied during the initial single crystal epitaxial growth phase or process of the silicon carbide layer. Thus the introduction of the nitrogen atoms is in addition to the doping profile of the silicon carbide layer.

It would be appreciated that the doping of the SiC material can have nitrogen material, but the introduction of the nitrogen material during the doping of the layer is not the same as introducing nitrogen atoms during the epitaxial growth of the SiC layer. The present invention is directed to applying nitrogen atoms during the epitaxial growth process (which is separate from the doping process of the SiC layer).

It would be appreciated that there is a difference between the epitaxial growth process and deposition process. In a deposition process, materials are created directly from chemical reactions in gas and/or liquid (phase) compositions, the products of those chemical reactions arriving on the solid substrate in an incoherent "rain". The solid material is usually not the only product formed by the reaction. By products can include gases, liquids and even other solids. Examples of the deposition process include Low Pressure Chemical Vapour Deposition (LPCVD) and Plasma Enhanced Vapour Deposition (PECVD). By way of contrast, epitaxial growth process is completely different than the deposition process. If the substrate is an ordered semiconductor crystal (i.e. silicon, gallium arsenide, etc), it is possible with this process to continue building on the substrate with the same crystallographic orientation with the substrate acting as a template for the growth by adsorption of precursor species on that surface into precise crystal lattice locations. Deposition process includes incoherent rain of an amorphous or a small grain size polycrystalline material. Epitaxial growth process includes continuation of the single crystal structure of the substrate. In deposition process high Nitrogen flows can change the macroscopic structure of the amorphous or polycrystalline materials, eg reducing grain size, which can affect stress due to TCE differences. In epitaxial growth process much lower Nitrogen flows are fully incorporated into the microscopic crystal structure to apply a compressive stress by means of differences in atomic size compared to the host crystal.

The key point is that the structures and mechanisms are different in the two situations and therefore it would be appreciated that the present technique of applying nitrogen atoms during crystal growth process is particularly applicable to epitaxial growth process.

The present invention is specifically concerned with the epitaxial growth process of SiC on Si and applying nitrogen atoms during the epitaxial growth process to reduce wafer bow.

In the present invention, nitrogen atoms constitute about 0.5% to 0.001% of the gas phase during the epitaxial growth process which occurs at a typical growth temperature of 1370° C. Generally 0.25% of nitrogen in Hydrogen is present to optimise the nitrogen content of the growing SiC from the point of view of stress and defects.

The application of the nitrogen atoms may generate the compressive stress to countermand a natural tensile stress causing the bow of the composite wafer.

The compressive stress may be generated at the same place within the composite wafer where the natural tensile stress may be generated.

The interface between the silicon wafer and the silicon carbide layer may include dislocations or crystal defects. The dislocations or crystal defects at the interface may incorporate the nitrogen atoms at a higher rate than a single crystal.

The silicon carbide layer may be a 3-step cubic silicon carbide (3C—SiC). The process may be applicable to other silicon carbide type materials as well.

The application of nitrogen atoms may cause the substantially central part of the composite wafer to be substantially flattened so as to reduce the bow of the composite wafer. This technique enables the overall the wafer to be substantially flattened so that one or more layers can be easily grown on top of the initial heteroepitaxy and to facilitate normal semiconductor device processing steps.

The nitrogen atoms may be applied to across the whole of the composite wafer, a final result can be that 75% of the wafer area may be between about +50 microns and about −50 microns of the wafer dimension.

The nitrogen atoms applied during the crystal growth of the silicon carbide layer may be in addition to those which form part of the doping concentration of the silicon carbide layer. Broadly speaking, 3C—SiC layers generally have nitrogen in the doping concentration but the introduction of the nitrogen atoms during the initial crystal growth process is a separate technique from that used for forming the doping concentration.

The composite wafer may be an on-axis wafer. Alternatively, the composite wafer may be an off-axis wafer.

According to a further aspect of the present invention, there is provided a silicon carbide semiconductor structure comprising: a monocrystalline silicon wafer; a silicon carbide layer grown on the monocrystalline silicon wafer. The interface between the silicon wafer and the silicon carbide layer includes nitrogen atoms which are applied during the initial growth process of the silicon carbide layer so as to generate a compressive stress within the semiconductor structure.

The nitrogen atoms may be applied during the initial crystal growth phase of the silicon carbide layer.

The application of the nitrogen atoms may generates the compressive stress to countermand a natural tensile stress causing the bow of the semiconductor structure.

The compressive stress may be generated at the same place within the semiconductor where the natural tensile stress is generated.

The interface between the silicon wafer and the silicon carbide layer may include dislocations or crystal defects.

The dislocations or crystal defects at the interface may incorporate the nitrogen atoms at a higher rate than a single crystal.

The silicon carbide layer may be a 3-step cubic silicon carbide (3C—SiC).

The application of nitrogen atoms may cause the substantially central part of the semiconductor to be substantially flattened so as to reduce bow of the semiconductor structure.

The nitrogen atoms may be applied across the entire semiconductor structure area.

The nitrogen atoms applied during the crystal growth of the silicon carbide layer may not form part of the doping concentration of the silicon carbide layer.

The silicon wafer is an on-axis wafer. Alternatively, the silicon wafer may be an off-axis wafer.

In embodiments, there is provided a SiC device comprising: the semiconductor structure as described above; and one or more semiconductor device or transistor structures over the semiconductor structure.

A SiC diode may incorporate the SiC device above. A SiC insulated gate bipolar transistor (IGBT) may incorporate the SiC device above. A SiC MOSFET may incorporate the SiC device above.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

DETAILED DESCRIPTION OF THE PREFERRED EMBODIMENTS

Before describing embodiments of the present invention, a silicon carbide/silicon heteroepitaxy process will be described with reference to FIGS. 1a to 1e which may be useful for understanding the present invention.

Figure 1:
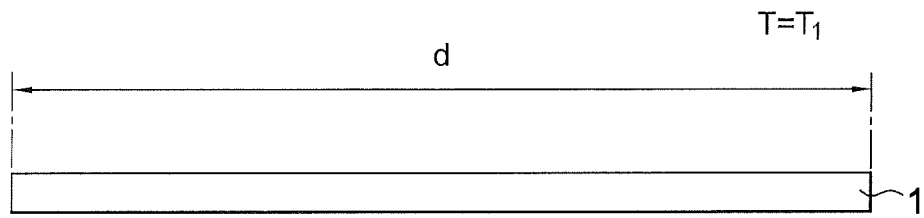
FIGS. 1a to 1e illustrates stages during a first process of heteroepitaxy.
Figure 1:
Figure 1:
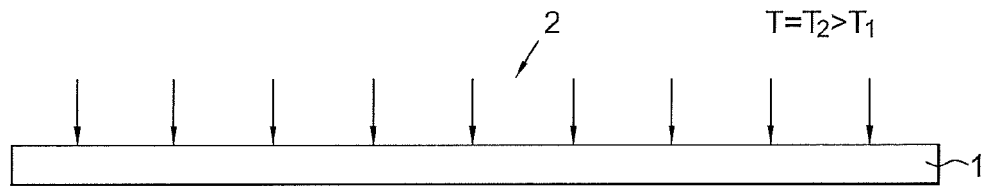
Figure 1:
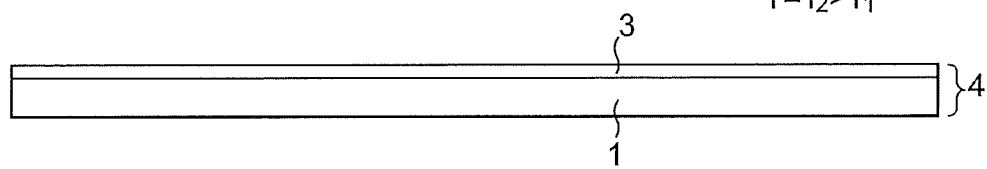
Figure 1:
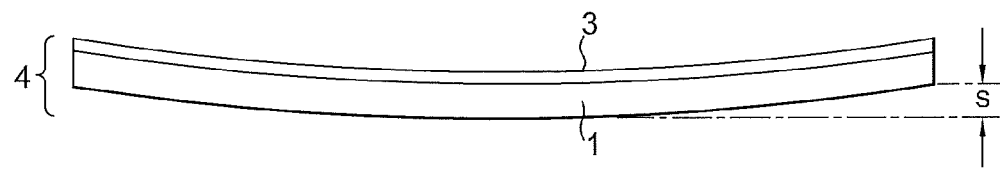

FIG. 1a shows a monocrystalline silicon wafer 1 at a room temperature (about 25° C.). The silicon wafer 1 serves as a seed wafer on which a layer of three-step cubic silicon carbide (3C—SiC) can be epitaxially grown. The silicon wafer 1 has a diameter, d.

The silicon wafer 1 is placed in a silicon carbide epitaxial reactor (not shown) and is heated to about 1350° C. As shown (in highly schematic form) in FIG. 1b, the silicon wafer 1 expands when heated. The heated wafer has a diameter, d', greater than diameter, d, of the wafer at room temperature.

Referring to FIG. 1c, the heated silicon wafer 1 is exposed to a vapour 2 of silicon and carbon reactive species in a chemical vapour deposition (CVD) process. The vapour 2 adsorbs on the silicon wafer 1 forming three-step cubic silicon carbide. Although, the lattice constants of silicon carbide and silicon normally differ, an epitaxial layer 3 of three-step cubic silicon carbide grows on the silicon substrate 1 matching the lattice constant of silicon by means of lattice dislocations (not shown) and forming a composite structure 4, as shown in FIG. 1d. However, a residual tensile stress is generated during the formation of the structure.

In addition, as shown in FIG. 1e, when the composite structure 4 is allowed to cool, the silicon carbide epitaxial layer 3 shrinks at a faster rate than the underlying silicon wafer 3, generating a further tensile stress, and so the structure 4 bows.

The present invention seeks to address this problem.

Figure 2:
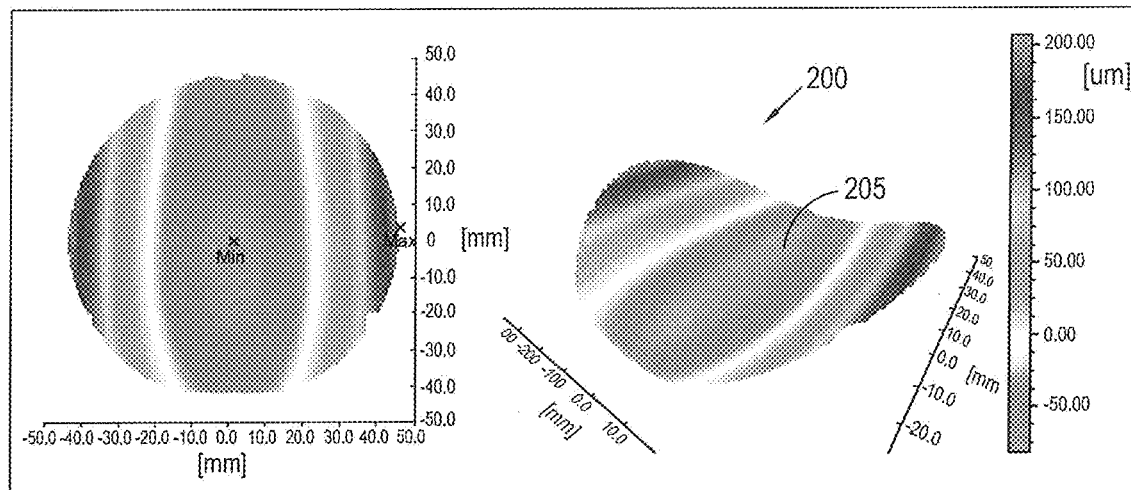
FIG. 2 illustrates a bow profile of a two dimensional off-axis Si wafer [100] in which no nitrogen atoms has been applied.

FIG. 2 illustrates a bow profile of a two dimensional off-axis Si wafer [100] in which no nitrogen atoms has been applied. As can be seen, the off-axis wafer 200 has a curved shape in which the wafer is bowed from the centre 205. The wafer of FIG. 2 demonstrates the bow in an experimental wafer, whereas FIG. 1e demonstrates the bow in a schematic illustration.

In the present invention, the technique applied to reduce the wafer bow is very simple, which includes introducing Nitrogen (an n-type dopant in SiC) during crystal growth to develop a compressive stress. This is because Nitrogen substitutes for Carbon in the crystal lattice, but is smaller, and hence produces a compressive stress. It will be appreciated that the present technique includes applying Nitrogen atoms during the crystal growth process of 3C—SiC in addition to those introduced to provide a doping profile in the 3C—SiC. The Nitrogen atoms are introduced to generate a compressive stress within the 3C—SiC layer and the composite wafer, which can countermand the tensile stress generated within the wafer. This technique is a separate step from introducing Nitrogen for creating a doping profile.

Figure 3:
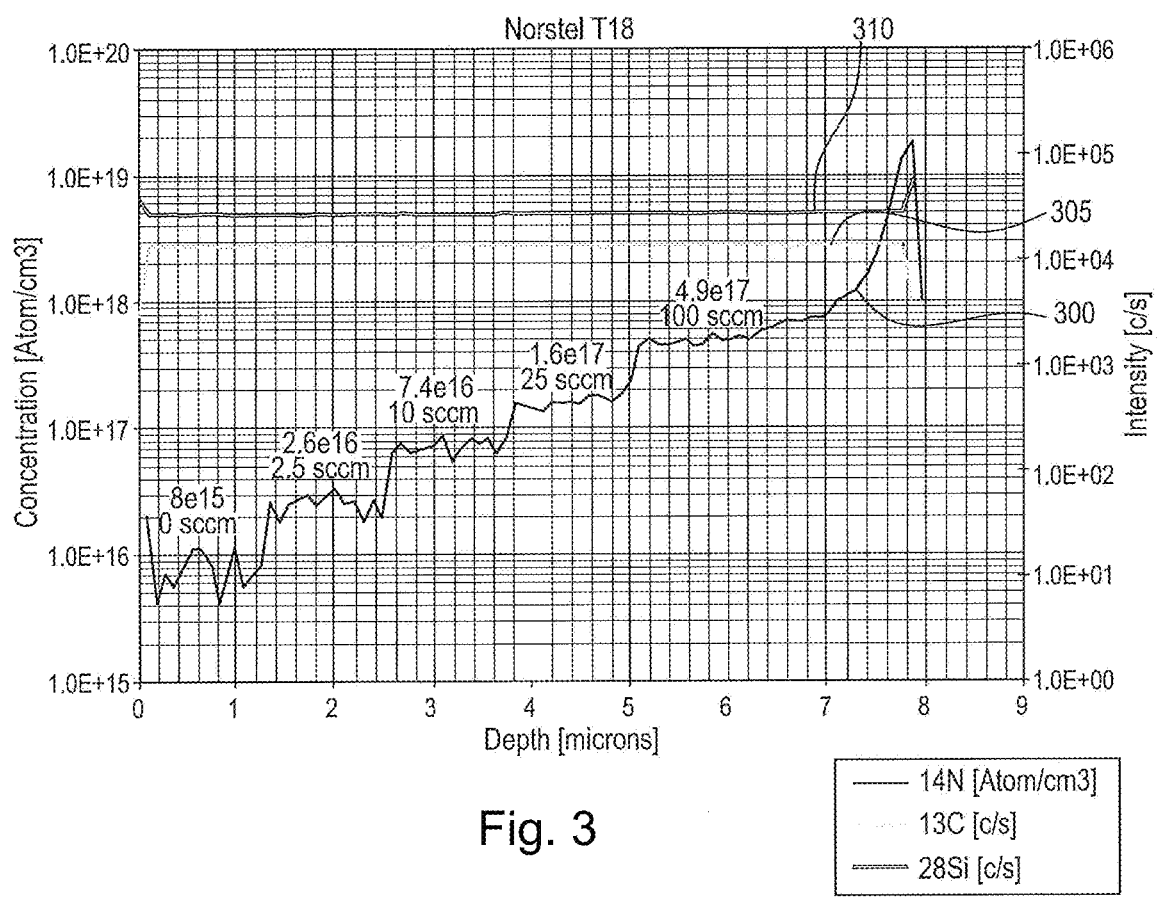
FIG. 3 shows a Secondary Ion Mass Spectrometry (SIMS) profile for Si, 3C—SiC and nitrogen atoms.

In embodiments, the nature of the interface assists in this process in that there is a high concentration of crystal defects at the Si/SiC interface and these defects incorporate Nitrogen at a much higher rate than normal single crystal. FIG. 3 shows a Secondary Ion Mass Spectrometry (SIMS) profile for Si, 3C—SiC and nitrogen ions. The SIMS profile of FIG. 3 shows a nitrogen (atomic) flow versus doping concentration calibration. The nitrogen flow 300 was kept constant in the bottom ~3.6 microns of the SiC layer at 100 sccm (standard cubic centimetre per minute), but it is clear that the incorporation rate is high at the interface gradually reducing to the equilibrium single crystal value. The nitrogen profile in FIG. 3 is an atomic profile and it shows that the flow of Nitrogen atoms during the epitaxial growth process is more effective in the interface of the Si/3C—SiC. The higher rate of incorporation of nitrogen helps to generate compressive stress at the same point where a tensile stress is naturally generated. Therefore the compressive stress countermands the tensile stress to push/pull the wafer at a location where a natural bow may be formed.

Figure 4:
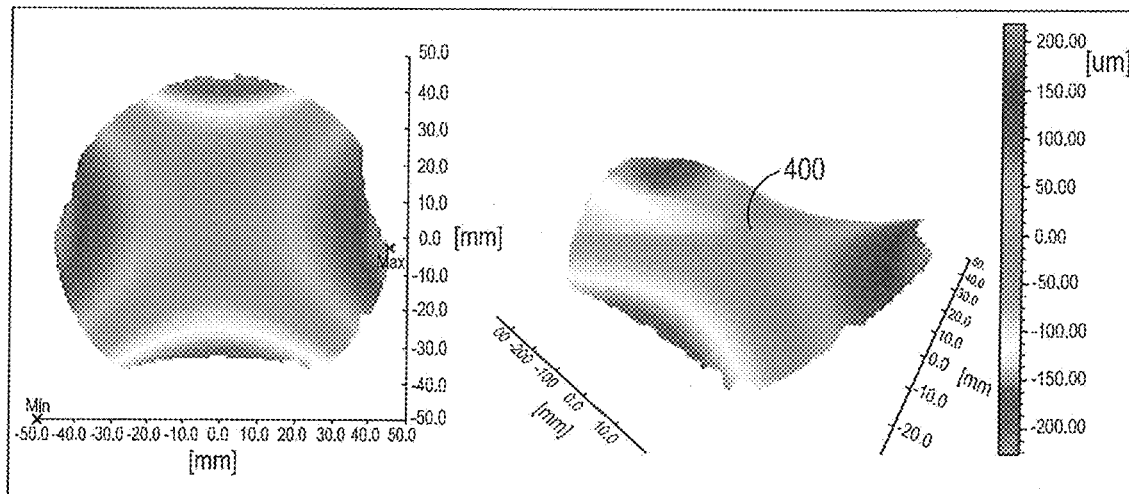
FIG. 4 illustrates a bow profile of a two dimensional off-axis Si wafer [100] in which nitrogen atoms has been applied.

FIG. 4 illustrates a bow profile of a two dimensional off-axis Si wafer [100] in which nitrogen atoms has been applied. In this example, about 200 sccm of Nitrogen is added in the initial growth phase of the silicon carbide layer. This produces a more complex shape compared to the shape of FIG. 2. After applying the nitrogen atoms in the initial growth phase, the wafer forms a 'Pringle' shape. As can be seen in FIG. 4, the centre 400 of the wafer has been raised due to the reduction of total stress, because of the introduction of a compressive stress.

Figure 5:
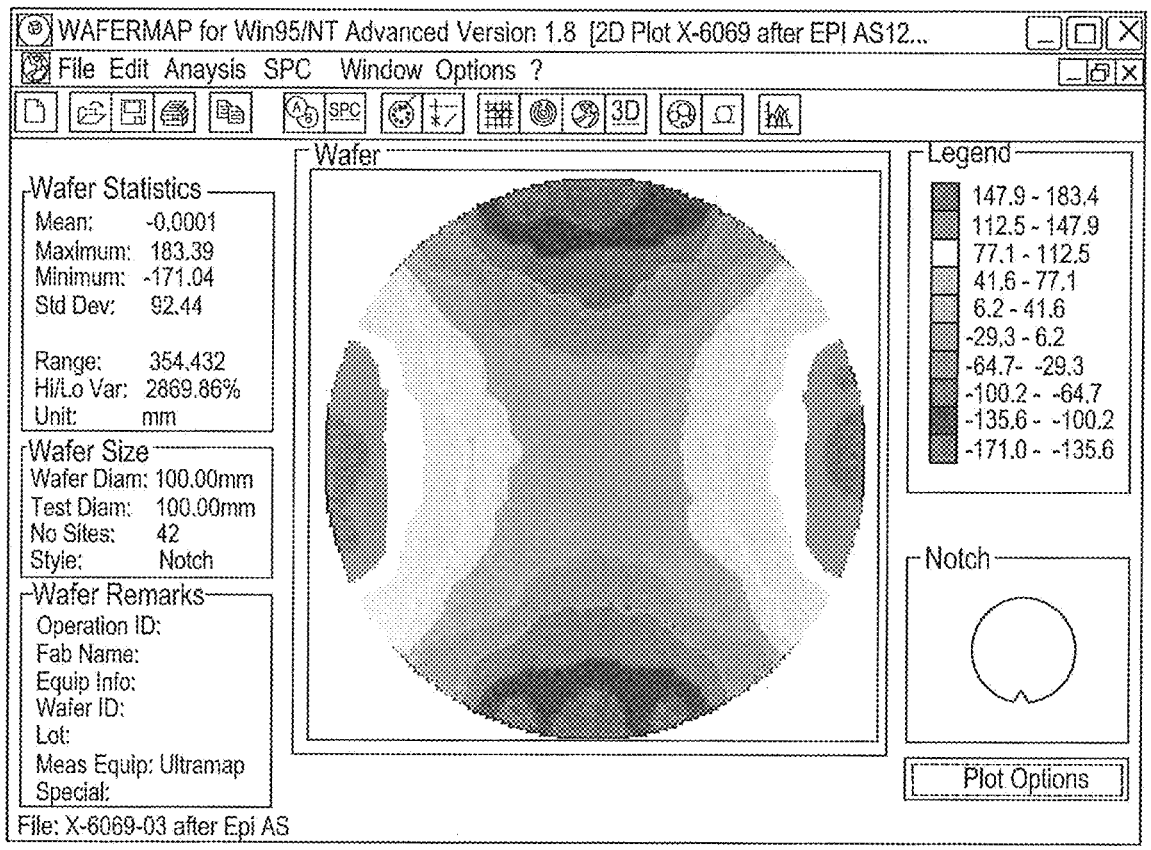
FIG. 5 illustrates an alternative bow profile of a two dimensional off-axis Si wafer [100] in which nitrogen atoms has been applied.

FIG. 5 illustrates an alternative bow profile of a two dimensional off-axis Si wafer [100] in which nitrogen atoms has been applied. It will be appreciated that an optimised process may produce a wafer with drastically reduced bow, and with the overall profile optimised for use in process equipment. An example of such a wafer is shown in FIG. 5. Broadly speaking the target may be to have a maximum wafer area between about +50 microns and about −50 microns in height.

Figure 6:
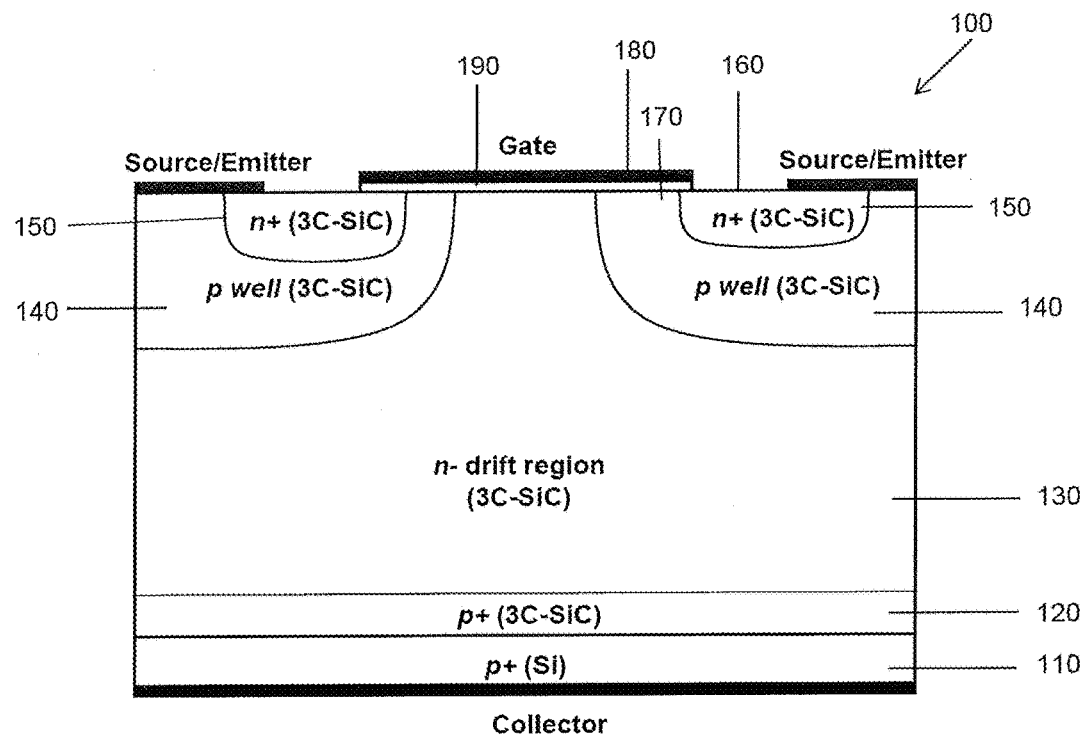
FIG. 6 illustrates a vertical power semiconductor transistor 100 in the form of an insulated gate bipolar transistor (IGBT)

FIG. 6 illustrates a vertical power semiconductor transistor 100 in the form of an insulated gate bipolar transistor (IGBT). The transistor 100 has a p-type silicon substrate 110 and a first 3-step cubic silicon carbide (3C—SiC) epitaxial layer 120 grown using the process described in the embodiments above in the present application. Nitrogen atoms are flown or applied in the interface between the substrate 110 and epitaxial layer 120. This technique helps to reduce the wafer bow or provides a substantially flat surface for the epitaxial layer 120. Therefore further 3C—SiC layers are formed on top of the substantially flat surface of the epitaxial layer 120. In this example, the silicon carbide epitaxial layers 120, 130 include a heavily-doped p-type layer 120 which is supported on the p-type silicon substrate 110, and a lightly-doped n-type layer 130 which provides a drift region and which is supported on the p-type silicon carbide layer 120. The first epitaxial layer 120 provides a p-type collector. P-type wells 140 at the surface 160 of the epitaxial layer 130 provide body regions 140. N-type wells 150 within the p-type wells 140 provide contact regions and provide emitters. The body region 140 and the contact region 150 can be formed using 3C—SiC material. A channel 170 is formed beneath a gate 180 which is separated using a gate dielectric layer 190. All these layers are used using 3C—SiC layers.

Although in FIG. 6 the example of an IGBT is presented, it would be apparent to the skilled person that the present technique can be equally applicable to form other semiconductor devices and transistors, for example, diode, MOSFET, Thyristor.

Figure 7:
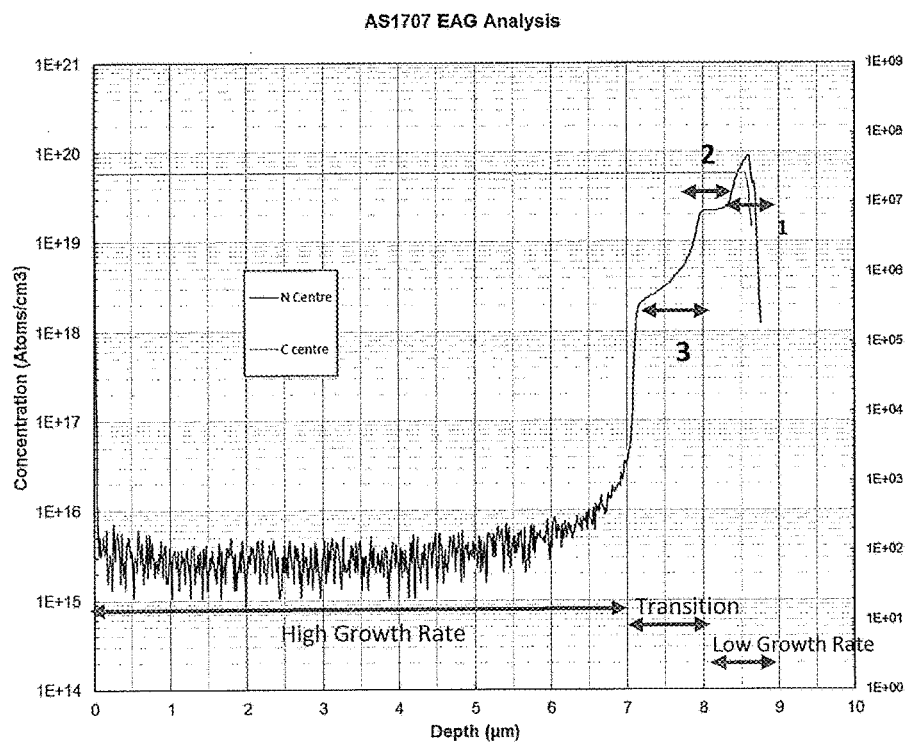
FIG. 7 illustrates the relationship of Nitrogen incorporation rate and epitaxial growth rate.

FIG. 7 illustrates the relationship of Nitrogen incorporation rate and epitaxial growth rate. As can be seen, when considering at the lower annotation on the graph which shows that there is a low growth rate process between about 8 and 9 micron depth and then the growth rate is ramped up during the transition (between 7 to 8 micron), and finally the majority of the layer is grown at a high growth rate (between 0 to 7 micron).

As can be seen, the nitrogen atom incorporation rate is inversely proportional to the growth rate, i.e. higher nitrogen atom incorporation is conducted when epitaxial growth rate is slower (e.g. about 8 micron). This is why it is advantageous (and cheaper) to grow the bulk of the layer where we want a low doping (drift region) as fast as possible.

Returning to the numbered regions of FIG. 7, the nitrogen flow is constant through regions 1, 2 and 3. The very high nitrogen atom incorporation rate in Zone 1 reflects the highly defective character of that region. It is established that adding a lot of N atom here helps the "defect self-cancellation effect" and minimises the thickness of Zone 1. The Zone 2 shows an equilibrium incorporation of N atom into a reasonably good crystal. It has been shown that the compressive stress is directly proportional to the thickness and doping density of Zone 2. The Zone 3 clearly shows the strong relationship between N atom incorporation rate and epitaxial growth rate. It is used to provide with a desirable graded electric field relief region. At the end of Zone 3 the N atom flow is switched off and we only obtain the background doping of the reactor which we want to be as low as possible.

Although the present specification makes reference to the interface of the silicon substrate and 3C—SiC epitaxial layer, it would be appreciated that the technique may also be equally applicable to other poly types of SiC.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

FIG. 7 illustrates the relationship of Nitrogen incorporation rate and epitaxial growth rate. As can be seen, when considering at the lower annotation on the graph which shows that there is a low growth rate process between about 8 and 9 micron depth and then the growth rate is ramped up during the transition (between 7 to 8 micron), and finally the majority of the layer is grown at a high growth rate (between 0 to 7 micron).

As can be seen, the nitrogen atom incorporation rate is inversely proportional to the growth rate, i.e. higher nitrogen atom incorporation is conducted when epitaxial growth rate is slower (e.g. about 8 micron). This is why it is advantageous (and cheaper) to grow the bulk of the layer where we want a low doping (drift region) as fast as possible.

Returning to the numbered regions of FIG. 7, the nitrogen flow is constant through regions 1, 2 and 3. The very high nitrogen atom incorporation rate in Zone 1 reflects the highly defective character of that region. It is established that adding a lot of N atom here helps the "defect self-cancellation effect" and minimises the thickness of Zone 1. The Zone 2 shows an equilibrium incorporation of N atom into a reasonably good crystal. It has been shown that the compressive stress is directly proportional to the thickness and doping density of Zone 2. The Zone 3 clearly shows the strong relationship between N atom incorporation rate and epitaxial growth rate. It is used to provide with a desirable graded electric field relief region. At the end of Zone 3 the N atom flow is switched off and we only obtain the background doping of the reactor which we want to be as low as possible.

The invention claimed is:

1. A method for reducing bow in a composite wafer comprising a silicon wafer and a silicon carbide epitaxial layer grown on the silicon wafer, the method comprising:
    applying nitrogen atoms during the epitaxial growth of the silicon carbide epitaxial layer on the silicon wafer so as to generate a compressive stress within the composite wafer;
    wherein the epitaxial growth occurs at an epitaxial growth rate; and
    wherein the epitaxial growth takes place over a low growth rate region, a transition region, and a high growth rate region; and
    wherein the nitrogen atoms are incorporated into the silicon carbide epitaxial layer at a first incorporation rate close to an interface in the low growth rate region; and
    wherein the nitrogen atoms are incorporated into the silicon carbide epitaxial layer at an incorporation rate which is inversely proportional to the epitaxial growth rate in the silicon carbide epitaxial layer in the low growth rate region away from the interface and in the transition region; and
    wherein the nitrogen atoms incorporated during the single crystal epitaxial growth of the silicon carbide epitaxial layer are in addition to the nitrogen of the doping concentration of the silicon carbide epitaxial layer so that the nitrogen atoms do not form part of the doping concentration of the silicon carbide epitaxial layer.

2. A method according to claim 1, wherein the nitrogen atoms are applied during the single crystal epitaxial growth phase of the silicon carbide layer.

3. A method according to claim 1, wherein the application of the nitrogen atoms generates the compressive stress to countermand a natural tensile stress causing the bow of the composite wafer, and optionally the compressive stress is generated at the same place within the composite wafer where the natural tensile stress is generated.

4. A method according to claim 1, wherein the interface between the silicon wafer and the silicon carbide layer includes dislocations or crystal defects, and optionally wherein the dislocations or crystal defects at the interface incorporates the nitrogen atoms at a higher rate than a single crystal.

5. A method according to claim 1, wherein the silicon carbide layer is a 3-step cubic silicon carbide (3C—SiC); and/or
    wherein the application of nitrogen atoms causes the substantially central part of the composite wafer to be substantially flattened so as to reduce the bow of the composite wafer; and/or
    wherein the nitrogen atoms are applied across substantially the whole area of the composite wafer; and/or
    wherein the nitrogen atoms applied during the single crystal epitaxial growth of the silicon carbide layer do not form part of the doping concentration of the silicon carbide layer.

6. A method according to claim 1, wherein the composite wafer is an on-axis wafer or wherein the composite wafer is an off-axis wafer.

7. A method according to claim 1, wherein the nitrogen flow rate is zero in the high growth rate region.

8. A method for manufacturing a composite wafer, the method comprising:
    forming a silicon wafer;
    thermally growing a silicon carbide epitaxial layer on the silicon wafer to form the composite wafer; and
    applying nitrogen atoms during the thermal epitaxial growth of the silicon carbide epitaxial layer so as to generate a compressive stress within the composite wafer;
    wherein the epitaxial growth occurs at an epitaxial growth rate; and
    wherein the epitaxial growth takes place over a low growth rate region, a transition region, and a high growth rate region; and
    wherein the nitrogen atoms are incorporated into the silicon carbide epitaxial layer at a first incorporation rate close to an interface in the low growth rate region; and
    wherein the nitrogen atoms are incorporated into the silicon carbide epitaxial layer at an incorporation rate which is inversely proportional to the epitaxial growth rate in the silicon carbide epitaxial layer in the low growth rate region away from the interface and in the transition region; and
    wherein the nitrogen atoms incorporated during the single crystal epitaxial growth of the silicon carbide epitaxial layer are in addition to the nitrogen of the doping concentration of the silicon carbide epitaxial layer so that the nitrogen atoms do not form part of the doping concentration of the silicon carbide epitaxial layer.

9. A method according to claim 8, wherein the nitrogen flow rate is zero in the high growth rate region.

10. A silicon carbide semiconductor structure comprising:
    a monocrystalline silicon wafer;
    a silicon carbide epitaxial layer grown on the monocrystalline silicon wafer;
    wherein the interface between the silicon wafer and the silicon carbide layer comprises nitrogen atoms which are applied during the epitaxial growth process of the silicon carbide epitaxial layer so as to generate a compressive stress within the semiconductor structure;
    wherein the epitaxial growth occurs at an epitaxial growth rate; and
    wherein the epitaxial growth takes place over a low growth rate region, a transition region, and a high growth rate region; and
    wherein the nitrogen atoms are incorporated into the silicon carbide epitaxial layer at a first incorporation rate close to an interface in the low growth rate region; and
    wherein the nitrogen atoms are incorporated into the silicon carbide epitaxial layer at an incorporation rate which is inversely proportional to the epitaxial growth rate in the silicon carbide epitaxial layer in the low growth rate region away from the interface and in the transition region; and wherein the nitrogen atoms incorporated during the single crystal epitaxial growth of the silicon carbide epitaxial layer are in addition to the nitrogen of the doping concentration of the silicon carbide epitaxial layer so that the nitrogen atoms do not form part of the doping concentration of the silicon carbide epitaxial layer.

11. A semiconductor structure according to claim 10, wherein the nitrogen atoms are applied during the single crystal epitaxial growth phase of the silicon carbide layer.

12. A semiconductor structure according to claim 10, wherein the application of the nitrogen atoms generates the compressive stress to countermand a natural tensile stress causing the bow of the semiconductor structure, and optionally wherein the compressive stress is generated at the same place within the semiconductor where the natural tensile stress is generated.

13. A semiconductor structure according to claim 10, wherein the interface between the silicon wafer and the silicon carbide layer includes dislocations or crystal defects, and optionally wherein the dislocations or crystal defects at the interface incorporates the nitrogen atoms at a higher rate than a single crystal.

14. A semiconductor structure according to claim 10, wherein the silicon carbide layer is a 3-step cubic silicon carbide (3C-SiC).

15. A semiconductor structure according to claim 10, wherein the application of nitrogen atoms causes the substantially central part of the semiconductor structure to be substantially flattened so as to reduce bow of the semiconductor structure; and/or wherein the nitrogen atoms are applied across the substantially the whole area of the semiconductor structure; and/or wherein the nitrogen atoms applied during the crystal growth of the silicon carbide layer do not form part of the doping concentration of the silicon carbide layer.

16. A semiconductor structure according to claim 10, wherein the silicon wafer is an on-axis wafer or wherein the silicon wafer is an off-axis wafer.

17. A SiC device comprising:
the semiconductor structure according to claim 10; and
one or more semiconductor device or transistor structures over the semiconductor structure.

18. A SiC diode incorporating the SiC device of claim 17.

19. A SiC insulated gate bipolar transistor (IGBT) incorporating the SiC device of claim 17.

20. A SiC MOSFET incorporating the SiC device of claim 17.

21. A semiconductor structure according to claim 10, wherein the nitrogen flow rate is zero in the high growth rate region.

* * * * *